United States Patent [19]
Macovski

[11] Patent Number: 4,685,468
[45] Date of Patent: Aug. 11, 1987

[54] NMR IMAGING SYSTEM USING FIELD COMPENSATION

[76] Inventor: Albert Macovski, 2505 Alpine Way, Menlo Park, Calif. 29025

[21] Appl. No.: 476,474

[22] Filed: Mar. 18, 1983

[51] Int. Cl.⁴ .............................................. A61B 5/04
[52] U.S. Cl. .................................. 128/653; 324/309; 324/314
[58] Field of Search ................ 128/653; 324/309, 310, 324/314, 320

[56] References Cited

U.S. PATENT DOCUMENTS

| | | | |
|---|---|---|---|
| 4,329,646 | 5/1982 | Tsuda | 324/314 X |
| 4,417,209 | 11/1983 | Hounsfield | 324/309 |
| 4,418,316 | 11/1983 | Young et al. | 324/309 |
| 4,425,547 | 1/1984 | Sugimoto | 324/309 X |

FOREIGN PATENT DOCUMENTS 2121545  12/1983  United Kingdom ................ 324/309

Primary Examiner—Kyle L. Howell
Assistant Examiner—Francis J. Jaworski
Attorney, Agent, or Firm—Flehr, Hohbach, Test, Albritton & Herbert

[57] ABSTRACT

NMR imaging is achieved in the presence of temporal variations in the magnetic field. The volume is excited using broadband excitation. A signal is picked up in the plane of interest, using a small coil, and used to determine the frequency of the subsequent plane-selecting excitation. A similar coil can be used to pick up the signal used to image the plane using projections all in the same direction. This latter signal is used to provide the demodulation signals to decompose the selected plane into its constituent elements. In both cases, involving the excitation and decoding signals, drifts in the magnetic field are compensated for.

23 Claims, 6 Drawing Figures

NMR IMAGING SYSTEM USING FIELD COMPENSATION

BACKGROUND OF THE INVENTION

1. Field of the Invention

This invention relates to medical imaging systems using nuclear magnetic resonance. In a primary application the invention relates to providing NMR imaging systems which are relatively immune to variations in the magnetic fields.

2. Description of Prior Art

Nuclear magnetic resonance, abbreviated NMR, represents a new approach to medical imaging. For general descriptions of the various imaging methods we can use a number of references including the books, *NMR Imaging in Biomedicine* by P. Mansfield and P. G. Morris, Academic Press and *Nuclear Magnetic Resonance Imaging in Medicine,* published in 1981 by Igaku-Shoin, Ltd. Tokyo or review papers including "NMR Imaging Techniques and Applications: A Review," by P. A. Bottomley, *Rev. Sci. Instrum.,* vol. 53, September 1982, pp. 1319–1337, and "Fourier Transform Nuclear Magnetic Resonance Tomographic Imaging," by Z. H. Cho, et al., *Proceedings of the IEEE,* vol. 70, October 1982, pp. 1152–1173. In these, various NMR imaging systems are described, each requiring a highly stable magnetic field because of the critical nature of the magnetic resonance. Subtle variations in these fields can cause either severe distortions or complete loss of the image. As a result of these severe stability requirements, most manufacturers have begun to use superconducting magnets, which are both expensive and difficult to maintain. They are also incapable of reasonably rapid field variations, which is desirable for some studies such as relaxation times as a function of frequency.

This problem of a severe stability requirement was addressed in UK Application GB No. 2076542A by Godfrey N. Hounsfield of EMI Limited. In this patent small pickup coils are used to sample the received signals on either side of the object being studied. The output from these coils form the demodulating signals for the signals received from the principal receiver coil. Thus magnetic field variations during the time signals are received are compensated for.

This approach, however, does not compensate for field variations which cause errors in the transmitter or excitation signals. Also, the method shown requires complex handling of the signals when projections are taken in different directions. At least four separate pickup coils are required, preferably a pair for each projection angle, or a single pair of pickup coils which are rotated for each projection angle.

It would be highly desirable to have a self-compensating NMR imaging system which tolerated magnetic field changes. In a separate application by the same inventor entitled, "Pulsed Main Field Nuclear Magnetic Resonance Imaging System," Ser. No. 457,580 filed Jan. 23, 1983 an improved system of supplying the main magnetic field is described, using a pulsed electromagnet. This provides higher fields at reduced dissipation, lower cost, and flexibility of the magnetic field. It does have the disadvantage, however, of being potentially susceptible to variations in the magnetic field. A system which is self-compensating would solve this problem, and provide for a greatly improved and more flexible system.

SUMMARY OF THE INVENTION

An object of this invention is to provide an NMR imaging system which is immune to temporal instabilities of the field.

A further object of this invention is to provide a simplified method of providing automatic reference signals to demodulate the received NMR signals.

A further object of this invention is to provide a method of automatically exciting the region of interest with the correct frequency.

Briefly, in accordance with the invention, the volume being studied is excited using broadband radiation. Using a reference pickup coil, the signal corresponding to the desired region is used to control the generation of the plane-selecting excitation signal. A data acquisition system is used involving projections in one direction only. A fixed pair of reference pickup coils can then be used to simply determine the demodulation signals for every measurement.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
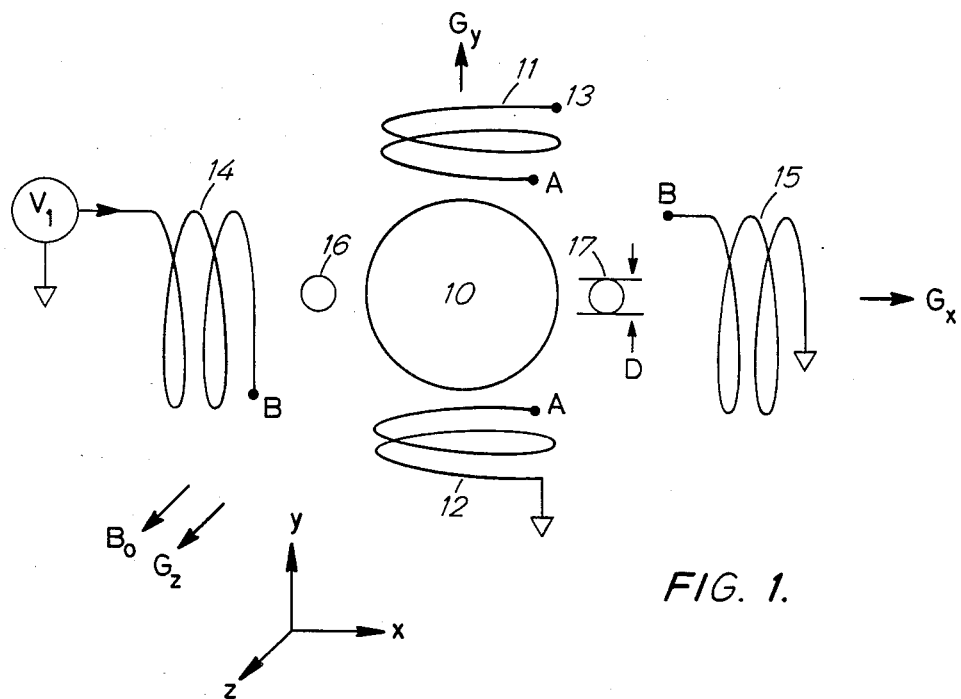
FIG. 1 is a schematic drawing illustrating an embodiment of the invention.
Figure 1A:
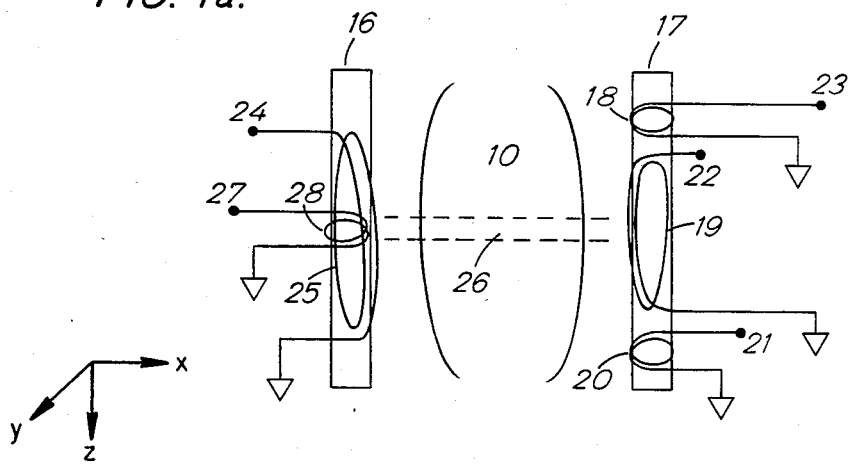
FIG. 1A is a top view of FIG. 1.

An understanding of the broad aspects of the invention may best be had by reference to FIGS. 1 and 1A, where an NMR image is desired of object 10. This is often a cross-sectional image of one or more planar sections, such as section 26. Other imaging modalities include projection imaging as described in pending U.S. applications by the same inventor Ser. No. 332,925 filed Dec. 21, 1981 for "Blood Vessel Projection Imaging System Using Nuclear Magnetic Resonance" and 332,926 filed Dec. 21, 1981 for "Selective Material Projection Imaging System Using Nuclear Magnetic Resonance", now U.S. Pat. No. 4,486,708. FIG. 1 includes what has now become the standard structures for all NMR imaging. This includes a source of the main magnetic field, of the order of 1-10 kilogauss, which is shown, for convenience, as $B_o$ in the z direction. These are presently used in a variety of forms including resistive electromagnets, super-cooled magnets and permanent magnets. The resistive magnets are inexpensive and allow flexibility of the magnetic field. Unfortunately their relative instability has made their operation somewhat different, which is the principal subject of this application. Also, in a recent pending application by the same inventor entitled "Pulsed Main Field NMR Imaging System", supra, a method is shown for supplying high magnetic fields without dissipation problems.

In general, selective imaging is accomplished using sequences of one or more gradient fields shown in FIG. 1 and $G_x$, $G_y$, and $G_z$. The nuclei in volume 10 are excited using rf coils 14 and 15 where the letters B are joined to form a series connection. These coils are driven by rf generator $V_1$. Although coils 14 and 15 could also be used to receive the resultant image signals, using appropriate switching, coils 11 and 12 are shown as providing the receiver function. These coils are shown in quadrature with the transmitter coils so as to minimize the pickup of the transmitter burst which can saturate the receiver input circuitry. These coils are connected in series, through joining the A terminals, and the resultant image signal appears on terminal 13.

Figure 2:
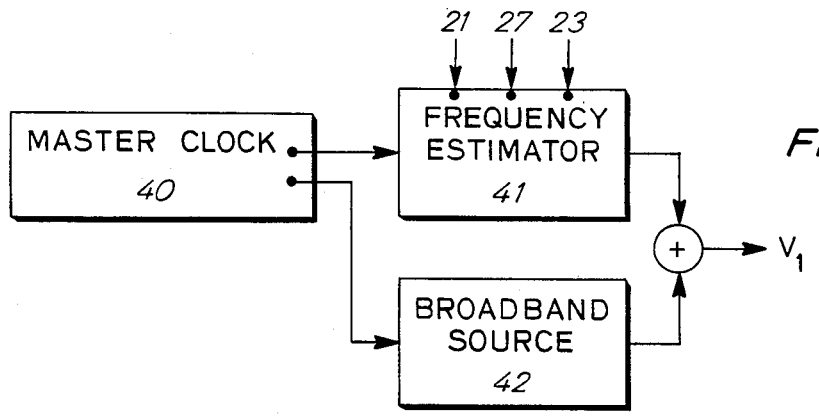
FIG. 2 is a block diagram of an embodiment for exciting the correct planar section.

In order to prevent serious errors and distortions occurring due to the drift and instability of the various field, a set of reference coils are added on either side of object 10. These are within or adjacent tubes of water 16 and 17 which are on either side of object 10 as shown in the end and side views of FIGS. 1 and 1A. The axes of all of the coil windings, 18, 19, 20, 25 and 28 are normal to the z axis so as to pick up NMR signals. They are shown having the same axis as receiver coil 13. The long coils 19 and 25 are used to supply reference signals for the receiver mode. The small coils, 18, 20, and 28 are used to automatically stabilize the excitation or transmitter mode as will be described with the aid of FIGS. 2 and 3.

To begin with, the entire volume of interest is excited using a broadband excitation signal which is generated using the appropriate clock pulses from master clock 40 driving broadband source 42 to provide signal segment 51 of $V_1$ which provides a 90° excitation or flip angle. A number of approaches can be used to excite the entire volume. The method shown uses a broadband rf burst in the presence of $G_z$ gradient signal segment 50. In this way, the various frequency components of 51 excite the different z planes of volume 10. Alternatively an adiabatic fast passage signal can also be used, without a $G_z$ gradient, to excite the entire volume. These signals, depending on the extent of the swept frequency, can provide a 90° or 180° flip angle. Also, signal segment 51 can be applied without gradient 50, where one frequency component of 51 would excite the entire volume.

Once excited, the volume will produce an FID (free induction decay) which will appear in image signal 13 as signal segment 55, and will also appear in each of the reference coils. However, signal 55 is of no interest since it is derived non-selectively from the entire volume. Similarly signal segment 58, in the receiver reference coils 22 and 24 is of no interest. For explanation purposes we will initially concentrate on signal 27 only. This signal is derived from coil 28 which, like coils 18 and 20, has a diameter comparable to the desired thickness of a planar section such as 26. In general, the resonant frequency of any planar section at position z is given by $$\omega = \gamma(B_O + G_z z)$$

where $\omega$ is the angular frequency and $\gamma$ is the gyromagnetic ratio for protons. Therefore every z plane along object 10, in the presence of $G_z$, will experience a different resonant frequency. If, however, we pre-assign a frequency to a z plane, drifts in $B_o$, the main field, will cause us to image the wrong plane, or completely miss the imaging region.

Figure 3:
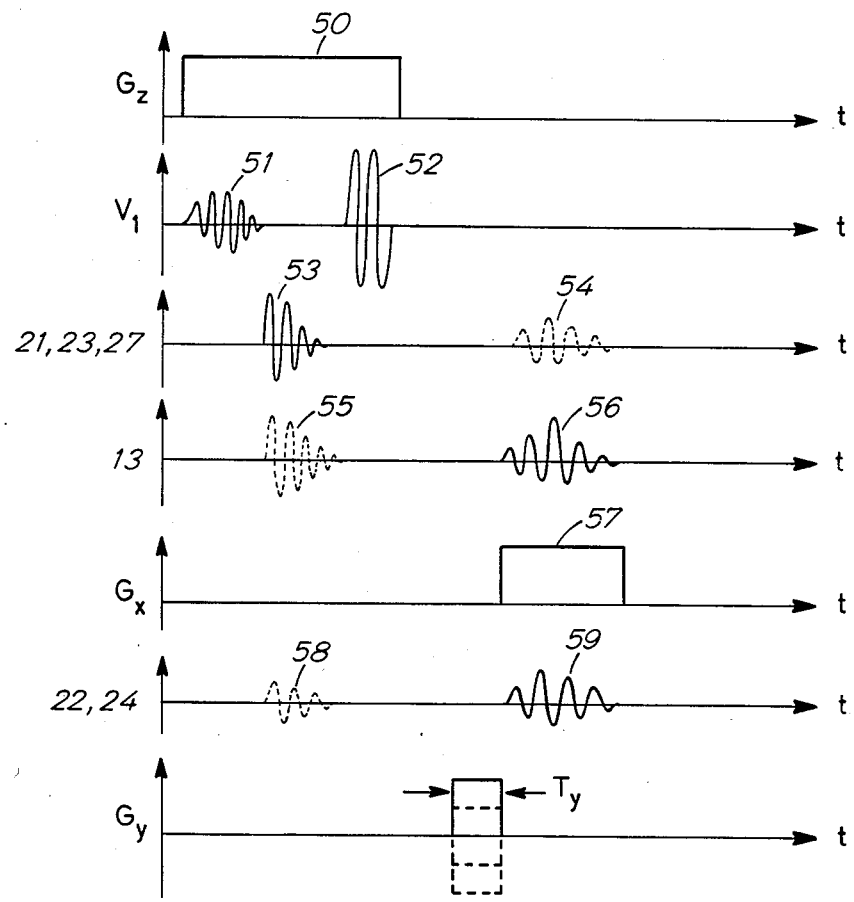
FIG. 3 is a set of waveforms illustrating an embodiment of the invention.

This is avoided, as indicated by FIG. 3, by receiving signal segment 53 from signal 27. This signal, as shown in FIG. 1A, is derived from a specific planar section. Therefore the frequency of signal segment 53 can be used to derive an excitation signal 52 for that plane. Similarly, excitation signal can be derived for any other plane using frequency estimator 41. For example, assume the frequency of signal 53, $\omega_o$, is derived from planar section $z_o$. The resonant frequency for any other plane z, $\omega_z$, can be simply derived as $$\omega_z = \omega_o + \gamma G_z(z - z_o)$$

Frequency estimator 41 can represent a wide variety of functions. For example, if we are simply interested in the plane $z_o$ itself, 41 can be a filter or locked oscillator which derives a signal from signal 53 itself. Alternatively, and more generally, 41 can derive an estimate of the frequency of 53 by measuring the time between axis crossings. Since many cylces are involved, this can be averaged over many cycles. Another approach is simply to count cycles over a given time interval. Once $\omega_o$ is estimated, the frequency for any plane $\omega_z$ is calculated in 41 as shown in the above equation. Estimator 41 then generates a narrow-band rf burst 52 of the calculated frequency $\omega_z$ to excite only the desired planar section. This excitation is thus independent of drifts of $B_o$. This excitation, of course, also takes place in the presence of gradient $G_z$.

The desired plane selection can experience a slight second-order error, as can be seen in the above equation, if the gradient $G_z$ drifts. Of course the field due to $G_z$ is orders of magnitude smaller than that of the main field $B_o$, making this a small effect. However, this can be compensated for using the two pickup signals 21 and 23 which substantially flank the volume of interest, although not necessarily. In this case different frequencies, $\omega_1$ and $\omega_2$ are received from each coil as given by $$\omega_1 = \gamma(B_o + G_z z_1)$$

and $$\omega_2 = \gamma(B_0 + G_z z_2)$$

where $z_1$ and $z_2$ are the planar sections adjacent coils 18 and 20. Frequency estimator 41, as previously described, estimates $\omega_1$ and $\omega_2$ from the signals 21 and 23 received from each of these coils which, for convenience, are both shown as signal segment 53. Once $\omega_1$ and $\omega_2$ are estimated, the frequency for any plane $\omega_z$ is given by interpolation or extrapolation as given by $$\omega_z = \omega_1 + \frac{z - z_1}{z_2 - z_1}(\omega_2 - \omega_1)$$

Note that this value of the required frequency $\omega_z$ for excitation signal 52 to excite plane z is independent of all fields, $B_o$ and $G_z$, by virtue of the two reference signals 21 and 23.

These methods represent a basic general system for the excitation of a desired region using dual excitation. In general a broadband excitation is used which is picked up by reference coils to determine which frequency corresponds to which region. This is immediately followed by a second narrow-band excitation signal defining the region of interest. Thus the compensation system uses a dual-excitation imaging system. In the imaging system illustrated in FIG. 3, the dual excitation involves a 90° burst (ignoring the resultant FID from the image signal) followed by a 180° inversion excitation, the combination producing a spin echo, signal segment 56, the image-forming signal.

Alternatively other dual excitation imaging can be used. These include inversion recovery where signal 51 can represent a broadband 180° inversion signal and 52 a narrow-band 90° signal giving rise to FID 56. The remainder of the system is identical to that shown and described using FIGS. 1-4. One problem with this inversion recovery excitation is that a relatively long time, in the order of 0.5 seconds, can exist between the two excitations, during which time drift of the fields can take place. To avoid this problem, an additional spin echo is produced. That is, the usually 180° and 90° burst are used, separated by a relaxation time of appropriate length. The 90° burst, instead of providing the image signal, is the wideband burst signal 51. Again, the FID is ignored and a spin-echo is produced by following signal 51, almost immediately, with the 180° inversion to provide spin-echo 56. Therefore a variety of multiple excitation systems can be used which are concluded with signals 51 and 52 which provide accurate selection of the region.

When image signal 56 is received, its frequency is also determined by the idiosyncrasies of the magnetic fields. Therefore, reference signals must be provided to accurately demodulate signal 56. In order to provide imaging, imaging signal 56 must be dispersed so that its frequency spectrum represents an array of line integrals projecting in the y direction, each at a different x position. This is accomplished using $G_x$ signal segment 57 as the x gradient during the time image signal 56 is received. Each line integral along the excited planar section then provides a frequency $w_x$ as given by $$\omega_x = \gamma(B_o + G_x x)$$

The imaging operation then involves decomposing 56 into its component frequencies, the amplitude of each component representing the desired line integral. Here again variations in $B_o$ and $G_x$ before and during image signal 56 can grossly distort the result.

Figure 4:
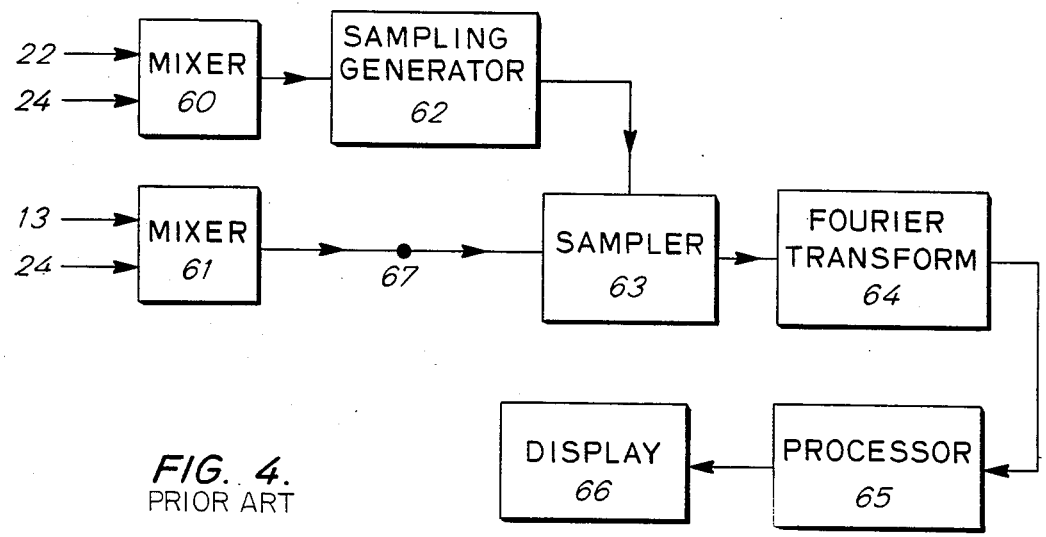
FIG. 4 is a block diagram of an embodiment for generating the correct sampling signals.

As previously indicated, this problem was solved in a unique way in UK Pat. No. 2076542 issued to G. N. Hounsfield of EMI. As illustrated in FIG. 4, the sampling of the received signal 13 is derived from reference signals 22 and 24. As seen in FIG. 1A, there are long coils, coupled to the water samples 16 and 17, which can pick up reference signals independent of which planar section is excited. As a result of gradient $G_x$, coils 25 and 19 pick up signals of two different frequencies, as shown in the previous equation, based on their x positions. Each of the signals picked up during the time of receiving image signal 56 are shown, for convenience, as reference signal 59, representing both the lower frequency signal 24 and the higher frequency signal 22, $\omega_1$ and $\omega_2$ respectively. These will change with the $B_o$ and $G_x$ fields, as will the spectrum of image frequencies of image signal 13.

As shown in FIG. 4, these are beat together in mixer 60 to form a signal of angular frequency $\omega_2 - \omega_1$ which is used to create a sampling signal in sampling generator 62 which is an appropriate multiple of $f_2 - f_1$, being at least a multiple of two. Using mixer 61, each image frequency $\omega$ is translated to $\omega - \omega_1$ thus occupying a range of angular frequencies $w_1$ to $w_2$, or somewhat less. This frequency translated image signal 67 is sampled in sampler 63 which, at any instant, has the correct sampling frequency to decompose the spectrum into a regular array along the x direction. Changes in gradient signal 57 or in $B_o$ will be compensated for by a change in the sampling rate. These samples are applied to digital Fourier transform structure 64 where the outputs are stored. Following the receipt of the complete array of projection signals, processor 65, in one of a number of classic approaches, provides the reconstructed image to display 66.

In the Hounsfield patent this method was used on systems requiring an array of projections at different angles. Therefore, either assemblies 16 and 17 rotated following each projection measurement sequence, or an array of such structures are placed around object 10. Both of these are extremely complex and of questionable operability. The Hounsfield patent also suggests a pair of such structures in quadrature with relatively complex processing to arrive at the required sampling frequency. In general, the practical applicability of this compensation system to multiple projection angle systems is questionable.

This approach, using a unique modification, can be applied to single angle projection systems to provide a unique and unanticipated result. Single angle projection systems have long existed in the literature and are included in the previously referenced paper by Paul A. Bottomley. One particularly simple single-angle projection system, the spin-warp system is illustrated in FIG. 3. Here, each projection is exactly as shown, with the identical excitation and gradient signals, except for the $G_y$ gradient which is applied for a time $T_y$ just prior to receiving image signal 59. Each nuclei along the y direction responds by oscillating at a different frequency as given by $$\omega_y = \gamma(B_o + G_y Y)$$

At the end of time $T_y$ this gradient is turned off so that each nuclei has experienced a phase shift $\theta_y = \omega_y T_y$. Ignoring the fixed portion of this phase shift, a change of phase of $2\pi$ radians, corresponding to a wavelength, takes place over a y distance given by $2\pi/\gamma T_y G_y$. This gives rise to a spatial frequency variation in the y direction of $\gamma T_y G_y/2\pi$. Thus each projection, which is frequency decomposed, as previously described, in the x direction, corresponds to a different spatial frequency in the y direction by using different values of $G_y$ as shown in FIG. 3. For an n×n cross-sectional image, approximately n different values of $G_y$ are required. These are processed in 65 to produce the final image in 66.

Using this imaging technique, reference signals may be derived as shown in FIGS. 1 and 1A with two fixed structures since, unlike the Hounsfield patent, the image signals are always derived with the projection angle in the same direction. If however, the pickup coils, as described in the Hounsfield patent and illustrated in FIG. 2 of that patent are used, the system as described will not function. The pickup coil shown has a relatively long extent in the y direction. As a result, when the $G_y$ signals are used, the cyclical phase variations within the pickup coil will cancel, thus cancelling much or all of the reference signal. As a result, as shown in FIGS. 1 and 1A, and in more detail in FIG. 5, the structure of the pickup coils 19 and 25 must be limited in the y extent, shown as distance D in FIGS. 1 and 5. The total phase shift across this structure, using the maximum value of $G_y$, corresponding to the highest spatial frequency in the y direction, should not exceed $\pi$ radians. This effectively represents the width of a pixel in the y direction, corresponding to a half wave at the highest spatial frequency.

Figure 5:
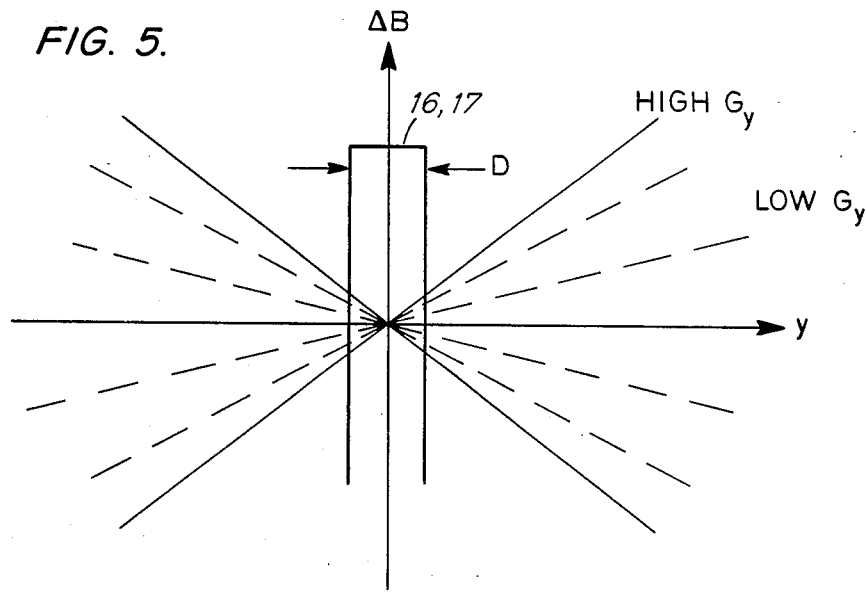
FIG. 5 is a graph illustrating an embodiment of the invention.

FIG. 5 shows the field in the y direction showing the change in magnetic field $\Delta B$ versus y for the range of gradient amplitudes. We require that for $G_y$ max, D is chosen so that the phase shift over the distance D does not exceed $\pi$ radians. Therefore $D \leq \pi/\gamma T_y G_y$ max, D values greater than this will result in a diminished reference signal for $G_y$ max which can become completely cancelled where the phase range is $2\pi$ radians.

It should be pointed out, however, that this restriction applies to the receiving reference coils 19 and 25. FIGS. 1 and 1A, for convenience, show all of the coils wound on the same water container 16 and 17. However, the transmitter reference coils 18, 20 and 28 can be made large, if desired, with appropriately larger water cores. Since no x or y gradients are involved during the excitation cycles, these coils and cores can be extended in the x and y direction, as long as they are confined to a narrow z plane.

The spin-warp system described is a cross-sectional imaging system involving projections in one dimension only. Another imaging system involving projections in one dimension only is projection imaging, as described in pending U.S. applications by the same inventor U.S. Ser. Nos. 332,925 and 332,926, supra. Here an array of projection lines along x are obtained, as shown in FIG. 3 without any $G_y$ gradient. Following image signal 56, the process is repeated using a different frequency for excitation signal 52 to select the next plane. Thus each plane in the volume is sequentially decomposed into arrays of projection lines in the y direction, resulting in a projection image of volume 10. The same referencing system previously described for excitation and receiving of signals is used for each projection plane. However, since $G_y$ gradient signals are not involved, the limits on D in the y direction for coils 19 and 25 are removed. Coils 19 and 25 can be extended in the y direction, along with water cores 16 and 17.

It should be emphasized that the system is operable, although non-optimum, if, in the system of spin-warp imaging, the y dimension of the cores of coils 19 and 25 is extended beyond the previously indicated values of D. For those projections involving lower values of $G_y$, as indicated in FIG. 5, where the phase variation across the coils are small, extending the y dimensions improves the collection efficiency and hence the SNR of the reference signal. However, for those projections involving higher values of $G_y$ or $\Delta B$, corresponding to higher spatial frequencies, the phase variations as previously indicated result in cancellations. However, if the size in the y dimension is carefully adjusted so that, for no gradient condition does it span an integral number of wavelengths or $2\pi$ radians, complete cancellation will never take place. Ideally, at the higher gradient values, it will be an odd multiple of $\pi$ radians, resulting in a strong signal. Of course, the signal can be increased by using more turns of wire, which is quite straightforward for these small reference coils.

Alternatively, two or more coils could be positioned along the y dimension with narrow ones providing the signals for the large values of $G_y$ and wider ones for the lower spatial frequencies corresponding to smaller values of $G_y$.

The limits in the x direction of coils 19 and 25, as shown in FIG. 1, are also approximately one picture element. This is true for both cross-sectional and projection imaging. In the presence of the x gradient $G_x$, these coils must supply reference signals corresponding to a single resolvable frequency, hence must be approximately the width of a picture element in the x direction.

This system can be applied to a wide variety of NMR imaging systems including volumetric and multiple-slice imaging. In multiple-slice systems a number of planar sections are excited in sequence and their resultant signals are received in sequence, following the appropriate relaxation intervals. Here the excitation frequency control system is used to accurately determine the proper frequencies for the sequence of slices. Using the spin-warp imaging system, collecting projection signals in one direction, the received signals are decomposed, using the automatic generation of reference signals, to provide the correct cross-sectional data.

A number of specific embodiments have been described whereby pickup coils are used to estimate the frequency resulting from an excitation, and that frequency or frequencies are then used to determine the frequency of subsequent excitations. This generalized concept can be used in any NMR procedure, including those not involving specific planes. For example, in the steady state free procession excitation system described in the previously referenced book by P. Mansfield, et. al., an initial excitation can again be used to determine the frequency for this SSFP excitation system.

The system thus described represents a unique and unanticipated method of providing geometrically accurate, artifact-free NMR imaging in both cross-section and projection, in the presence of relatively unstable magnetic fields. These fields could be those from resistive magnets which are much less stable, and less expensive, than superconductive magnets. In particular these fields could be from pulsed resistive magnets which have greater potential for instability, but also can provide very high fields at relatively low values of dissipation. Also, the fields could originate from permanent magnet systems which are plagued by wide variations due to temperature changes. Using the system described, expensive temperature stabilization would not be required.

What is claimed is:

1. In a method for NMR imaging of an object in the presence of temporally unstable magnetic fields the steps of:

exciting the volume of the object using a broadband excitation signal;

receiving a reference signal resulting from this first excitation using a pickup coil external to the object and confined to a planar section intersecting the object;

processing the reference signal to derive the frequency required for a particular planar section of the object;

exciting the particular planar section with a second excitation signal whose frequency is derived from the processing of the reference signal;

receiving an imaging signal resulting from the second excitation; and utilizing the imaging signal for the formation of an NMR image of the object.

2. The method as described in claim 1 including the steps of receiving additional reference signals from additional pickup coils and processing these additional reference signals whereby the frequency required for the particular planar section may be determined independent of gradient fields.

3. The method as described in claim 1 including the steps of receiving additional reference signals from pickup coils external to the object during the time the imaging signal is received and utilizing these additional reference signals to process the imaging signal in a manner independent of temporally unstable magnetic fields.

4. In a method for NMR imaging of an object in the presence of temporally unstable magnetic fields the steps of:
   receiving a sequence of image signals each received with an identical transverse magnetic gradient;
   receiving reference signals from a pair of pickup coils external to the object and having the line joining the two pickup coils parallel to the transverse magnetic gradient; and
   processing the received image signals using the received reference signals to produce an NMR image whereby frequency variations due to the unstable magnetic fields will be compensated for.

5. The method as recited in claim 4 wherein the NMR image is a cross-sectional image whose planar section is parallel to the transverse gradient and the cores of the pickup coils have a lateral extent of substantially one picture element including the step of applying a sequence of additional transverse magnetic gradient normal to the first transverse gradient of varying amplitude prior to receiving the image signals.

6. The method as recited in claim 4 including the steps of:
   exciting the volume of the object using a broadband excitation signal;
   receiving an excitation reference signal from a planar section of the object using a pickup coil; and
   exciting a particular planar section with a second excitation whose frequency is derived from the processing of the excitation reference signal, and which provides the image signals.

7. Apparatus for NMR imaging of an object in the presence of temporarily unstable magnetic fields comprising:
   means for exciting the volume of the object using a broadband excitation signal;
   a pickup coil having a core positioned external to the object which receives signals from a planar section which intersects the object;
   means for receiving a reference signal from the pickup coil and processing it to drive a second excitation signal representing a particular planar section whose frequency is based on the frequency of the reference signal;
   means for receiving imaging signals resulting from the second excitation; and
   means for utilizing the imaging signals for producing an NMR image of the object.

8. Apparatus as recited in claim 7 including one or more additional pickup coils and means for processing the additional reference signals from these coils to produce an estimate of the required frequency of the second excitation signal which is independent of gradient fields.

9. Apparatus as recited in claim 8 where pickup coils are positioned adjacent to two planar sections within the volume of the object and the means for processing the reference signals include means for interpolating between the frequencies of the reference signals derived from the coils adjacent to the two sections to derive the frequency required for the particular planar section.

10. Apparatus as recited in claim 7 including pickup coils external to the object for receiving image-related reference signals during the time the imaging signals are received and including means for processing the imaging signals using the image-related reference signals in a manner independent of temporally unstable magnetic fields.

11. Apparatus as recited in claim 7 where the axis of the pickup coil is in the plane of the planar section and the extent of the core in the dimension normal to the planar section is substantially the width of the planar section.

12. Apparatus as recited in claim 7 where the NMR image of the object is a cross-sectional image and including means for repeating the excitation of the planar section using different transverse gradient conditions.

13. Apparatus as recited in claim 7 where the NMR image of the object is a projection image and including means for sequencing through projections of an array parallel planar sections of the object.

14. Apparatus as recited in claim 7 where the means for exciting the object using a broadband excitation signal includes means for exciting the object with a signal having a broad radio frequency spectrum in the presence of a magnetic gradient normal to the planar section.

15. Apparatus as recited in claim 7 where the means for exciting the object using a broadband excitation signal includes means for exciting the object using a frequency-swept adiabatic fast passage signal.

16. Apparatus for providing an NMR image of an object in the presence of temporally unstable magnetic fields comprising:
   means for receiving a sequence of image signals with each signal received in the presence of identical transverse gradient signals;
   a pair of pickup coils with cores positioned external to the object and having the line joining the two pickup coils parallel to the transverse magnetic gradient;
   means for receiving reference signals from each of the pickup coils; and
   means for processing the image signals using the received reference signals whereby frequency variations due to unstable magnetic fields are compensated for.

17. Apparatus as recited in claim 16 where the NMR image is a cross-sectional image whose planar section is parallel to the transverse gradient and including means for applying a sequence of additional transverse magnetic gradients normal to the first transverse gradient of varying amplitude prior to receiving the image signals.

18. Apparatus as recited in claim 17 where the cores of the pickup coils have a lateral extent of substantially one picture element.

19. Apparatus as recited in claim 17 where the lateral extent of the cores of the pickup coils in the direction of the first transverse gradient is substantially one picture element and the lateral extent in the direction of the additional transverse gradient is such as to result in a phase shift across the core in that direction of substantially pi radians in the presence of the largest amplitude of this gradient.

20. Apparatus as recited in claim 16 including:
   means for exciting the volume of the object using a broadband excitation signal;

means for receiving an excitation reference signal from a planar section of the object using a pickup coil; and means for exciting a particular planar section with a second excitation signal whose frequency is derived from the processing of the excitation reference signal and which provides the image signals.

21. Apparatus as recited in claim 16 where the means for processing the received signals using the received reference signals include means for deriving a sampling signal using the beat frequency between the two reference signals and using this sampling signal to sample a signal derived from the product of the image signals and one of the reference signals.

22. In a method for providing the correct NMR excitation frequency the steps of:
applying a first rf excitation;
receiving a signal resulting from the first excitation;
estimating the frequency of the received signal; and
deriving the frequency of a subsequent excitation from the estimated frequency.

23. Apparatus for providing the correct NMR excitation frequency comprising:
means for applying a first rf excitation;
means for receiving a signal resulting from the first excitation;
means for estimating the frequency of the received signal; and
means for deriving the frequency of a subsequent excitation from the estimated frequency.

* * * * *